United States Patent [19]

Gilson

[11] Patent Number: 4,835,088
[45] Date of Patent: May 30, 1989

[54] METHOD AND APPARATUS FOR GENERATING HIGH-RESOLUTION IMAGES

[75] Inventor: Greyson Gilson, Newbury, N.H.

[73] Assignee: Submicron Structures, Inc., Nashua, N.H.

[21] Appl. No.: 136,416

[22] Filed: Dec. 22, 1987

[51] Int. Cl.$^4$ ............................ G03C 5/16; G02B 5/32
[52] U.S. Cl. ........................................ 430/323; 430/1;
430/269; 430/311; 430/322; 156/643;
250/492.3; 350/3.7; 350/162.11; 427/38;
427/53.1; 427/54.1; 437/20; 437/229
[58] Field of Search ....................... 430/1, 2, 311, 323,
430/322, 41, 269; 427/53.1, 54.1, 38; 437/20,
229; 250/492.3; 350/3.7, 3.75, 3.82, 162.11,
162.12; 156/643

[56] References Cited

U.S. PATENT DOCUMENTS 3,712,813  1/1973  Ross et al. .............................. 430/1

OTHER PUBLICATIONS

James E. Harvey, "Fourier Treatment of Near-Field Scalar Diffraction Theory", Am. J. Phys. 47(11), Nov. 1979, pp. 974–980.
Stroke et al., "Three-Dimensional Holography with 'Lensless' Fourier-Transform Holograms and Coarse P/N Polaroid Film", J. Opt. Soc. Am. tt, 1327 (1965), pp. 1327–1328.
George W. Stroke, "Lensless Fourier-Transform Method for Optical Holography", Applied Physics Letter, vol. 6, No. 10, May 15, 1965, pp. 201–203.

Primary Examiner—Jose G. Dees
Attorney, Agent, or Firm—Nutter, McClennen & Fish

[57] ABSTRACT

The exposure component (10) of a photo-etching system for a semiconductor wafer (28) includes a laser (12) that shines coherent light through an expansion lens (14) and then a contraction lens (16) to supply a spherically convergent beam of light through a lensless-Fourier-transform hologram (22) and onto the semiconductor wafer (28). The wafer (28) is located tangent to a hemisphere centered on the hologram (22) that has the focal point (26) of the convergent spherical beam at the middle of its curved surface. This forms a reduced version of the source image from which the hologram (22) was formed and achieves feature sizes significantly smaller than those attainable with conventional mask-type systems employing light of the same wavelength.

45 Claims, 3 Drawing Sheets ic circuits.
METHOD AND APPARATUS FOR GENERATING HIGH-RESOLUTION IMAGES

BACKGROUND OF THE INVENTION

The present invention is directed to generation of small images. It has particular, although not exclusive, application to microlithography of the type used in etching patterns during the production of integrated circuits.

The production of integrated circuits involves etching patterns into workpieces. In one common method, the pattern to be etched is initially produced in a large form by computer-generated-graphics equipment. The large-form pattern, or source image, is then reduced photographically to produce a mask, and light is projected through the resultant mask to create an object image on a workpiece. The workpiece typically is a wafer of silicon, sometimes with a metal-oxide layer, coated with a layer of photoresist, a substance whose solubility in a given solvent is affected by exposure to light. The solvent is applied to the workpiece so as selectively to remove the photoresist, and the workpiece is etched in the resultant pattern.

As integrated-circuit manufacturers have required increasingly small feature sizes, two diffraction-related problems in this method have become apparent. The first occurs in the production of the mask. To achieve the requisite size reduction, the light used in the reduction process must travel significant distances, and diffraction thus tends to smear features whose sizes approach the light's wavelength. For a given wavelength, therefore, diffraction tends to limit the extent to which feature sizes can be reduced. Since diffraction is a function of wavelength, of course, smaller feature sizes can be achieved by using shorter wavelengths. Indeed, so long as shorter wavelengths are available, there is no theoretical limit to how narrow the exposed region can be made. But it is more convenient and less expensive to employ photons that can be controlled by conventional optical equipment.

Still, it is possible to reduce the wavelength by employing shorter-wavelength photons, such as those associated with ultraviolet light or X-rays, or by employing beams of massive particles, such as electrons or ions, that have energies associated with shorter wavelengths. For example, the so-called direct-write system uses electrons to create the mask pattern. Rather than attempt somehow to reduce a large-form image "electrographically," however, the typical direct-write system generates a single electron beam having a beam energy high enough that it can be focused to a sufficiently small feature size, and the desired image pattern is "written" by deflecting the beam in the desired pattern over the surface of a mask medium. The medium is coated with electroresist, which is to electrons what photoresist is to photons, and the medium is then etched in much the same way as the ultimate workpiece is.

Although this method eliminates the diffraction problem, it does so at a relatively high cost, since it does not use easy-to-control optical-wavelength light. Moreover, it still leaves a second diffraction-related problem, that of exposing the workpiece. If the mask could be brought into contact with the workpiece or extremely close to it, diffraction would not be a problem in workpiece exposure. However, practical problems prohibit bringing the mask close enough to the workpiece to eliminate the diffraction problem. The light that exposes the photoresist must therefore travel a significant distance between the mask and the workpiece, so diffraction keeps the feature sizes on the workpiece from being as small as those of corresponding mask feature that approach the wavelength of the exposing light. Of course, the direct-write method can be used on the workpiece itself, but it suffers from the same expense disadvantage in circuit production as it does in mask production. Moreover, it is much slower than illumination through a mask, and the speed disadvantage is a significant drawback in volume circuit production.

In short, diffraction constitutes a significant problem in microlithography. It also presents a similar problem in other microfabrication techniques and in image-reduction processes generally.

SUMMARY OF THE INVENTION

The diffraction problem can be significantly reduced if the mask contains a Fourier transform of the image to be formed on the workpiece. Typically, the mask is a hologram. Light is directed through the hologram in such a manner as to form the inverse Fourier transform of the hologram contents on the workpiece, and a microfabrication operation such as etching is then performed on the workpiece in accordance with the image thus formed. Since the resolution of each feature is determined by the size of the entire hologram rather than by the size of individual features in a conventional mask, much-higher resolution can be achieved. The broader teachings of the invention can be practiced not only in microfabrication but also in many other applications that require high-resolution imaging.

BRIEF DESCRIPTION OF THE DRAWINGS

These and further features and advantages of the present invention are described in connection with the accompanying drawings, in which.

DETAILED DESCRIPTION OF AN ILLUSTRATIVE EMBODIMENT

Figure 1:
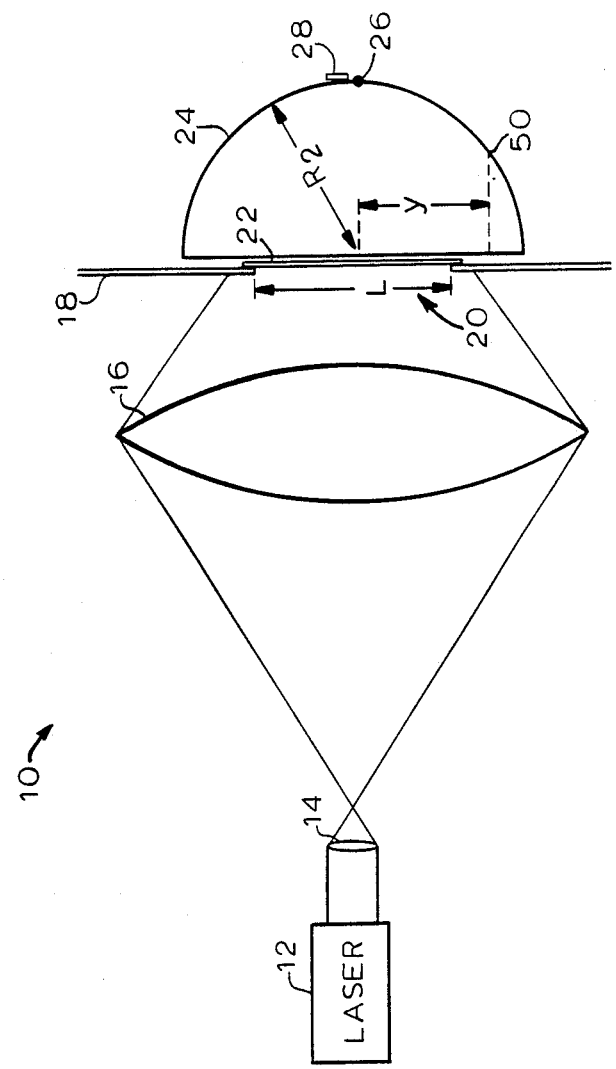
FIG. 1 is a diagram of an exposure system employing the teachings of the present invention.

FIG. 1 depicts an apparatus 10 for exposing a workpiece to light so as to form a pattern in which the workpiece, typically a semiconductor wafer, can be etched. The pattern selectively changes the solubility of photoresist deposited in a layer on the workpiece, and this selective change in solubility is used in subsequent operations to etch the semiconductor material, or a metal-oxide coating, in the pattern laid down by the apparatus. The apparatus 10 includes a laser 12, which produces substantially spatially coherent light and shines it through an expansion lens 14. The resultant beam expands until it is bent by a contraction lens 16, which converts it to a spherically convergent beam. The convergent beam shines on a mounting wall 18, which forms an aperture 20 in which a mask in the form of a transparency 22 is mounted.

According to the present invention, the transparency is not simply the image to be projected onto the workpiece. Instead, it includes a Fourier transformation of that image, typically formed by conventional lensless-Fourier-transform holography techniques. The illustrated optics are such as to form on the workpiece the inverse transform of the contents of transparency 22 and thereby form a reduced-size replica of the object image from which the hologram was formed.

Specifically, a glass hemisphere 24 is disposed on the side of the wall 18 opposite the contraction lens 16. The position of the glass hemisphere 24 and its radius $r_2$ are such that, in the absence of the wall 18 and the transparency 22, the light beam would converge at a focal point 26 on the surface of the glass hemisphere 24 or just beyond it.

However, the light does not completely converge on the focal point 26, partially because of the limited size of the aperture 20 and the lenses 14 and 16 but mostly because of the interference of the transform transparency 22. The transform transparency scatters the light in such a way as to reconstruct, typically in a greatly demagnified form, the source image of which the transparency 22 contains a Fourier transform. The resulting pattern is formed on a workpiece 28, which is covered with a photoresist coating that the pattern exposes for a period of time determined by a shutter (not shown) in the laser device 12. The workpiece 28 is then treated in a conventional manner to etch it in accordance with the pattern.

This arrangement produces a high resolution because the diffraction accompanying each feature in the image is determined by the relatively wide aperture width L—that is, by the size of the entire transparency. This contrasts with conventional non-transform-type mask, in which the diffraction angle is determined by only the small part of the transparency that carries a particular image feature. Thus, the diffraction angle for any given feature in a multi-feature transparency is less for a system of the illustrated type than it is for a conventional non-transform-type exposure system.

Figure 2:
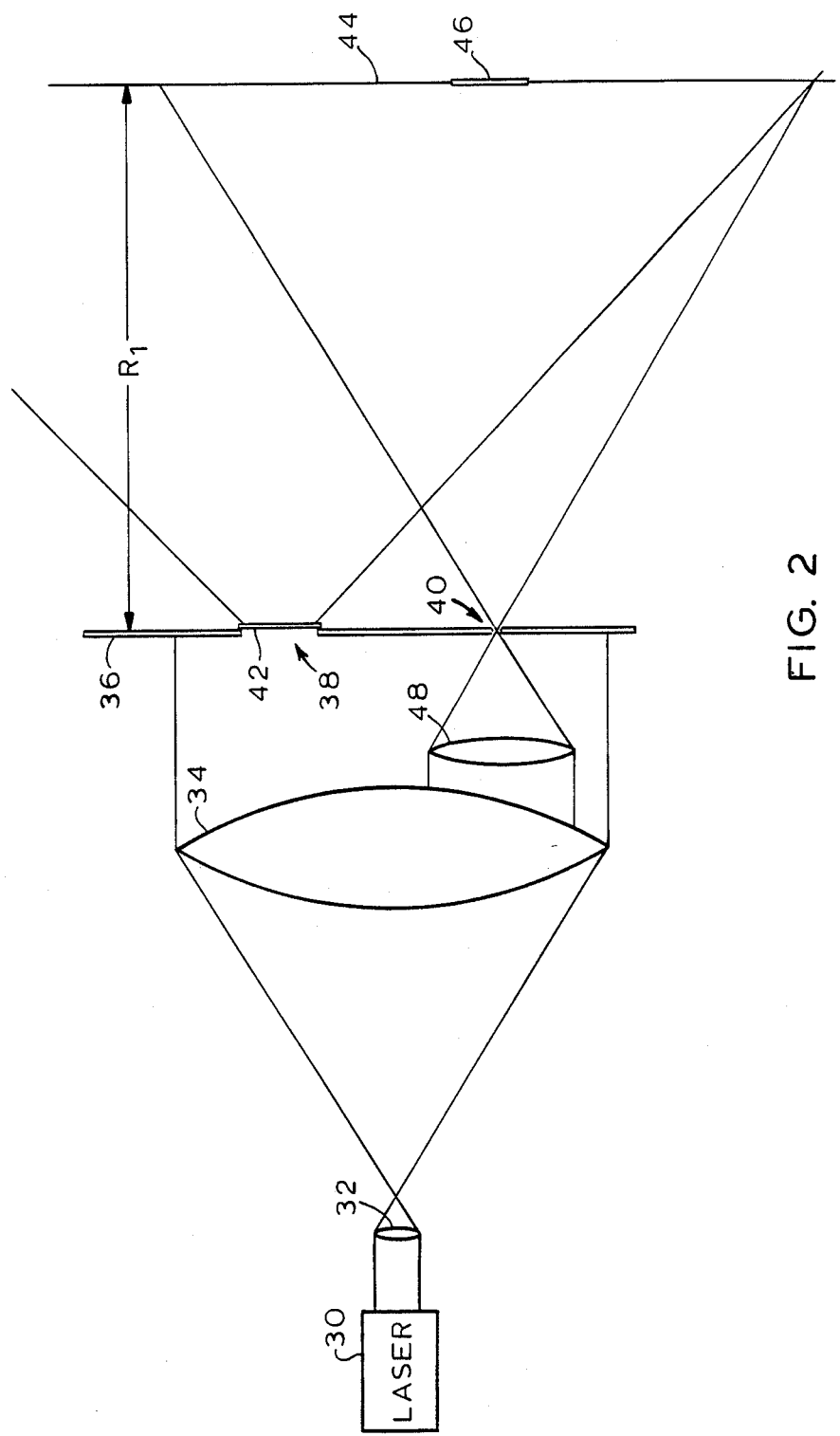
FIG. 2 is a diagram of an arrangement for producing a lensless-Fourier-transform hologram for use in the exposure system of FIG. 1.

The transform transparency can be produced by any process for producing Fourier transforms. One process for producing images that include Fourier transforms is a lensless-Fourier-transform holography process such as that illustrated in FIG. 2. FIG. 2 depicts a laser 30, an expansion lens 32, and a collimation lens 34. The expansion lens 32 performs a function the same as that performed by the expansion lens 14 of FIG. 1, but the collimation lens 34 bends the light less than he contraction lens 16 in FIG. 1 does, so it converts the spherically expanding beam that it receives into a planar beam, which it directs at a wall 36.

Wall 36 forms a large aperture 38 and a small, "pinhole" aperture 40. Mounted in the large aperture 38 is a source transparency 42, which contains a source image of which a reduced version is to be formed on the workpiece 28. Each element of the source transparency 42 scatters the incoming light to produce spherical wavefronts that propagate to a plane 44 disposed at a distance $R_1$ from wall 36. As is not apparent in FIG. 2, $R_1$ should be many times the distance between the pinhole 40 and the upper end of the larger aperture 38. The hologram is to be recorded on a recording medium 46, typically high-resolution photographic film mounted in the plane 44.

A reference lens 48 bends the planar wavefronts received from the collimation lens 34 so as to focus the light into the pinhole 40. The light thus focused emerges as a spherical-wavefront beam, which interferes with the light from the transparency 42. The wall 36 blocks out substantially all light other than that projected through the object transparency 42 or the pinhole 40, and it eliminates some sidelobe radiation resulting from the finite size and imperfections of the reference lens 48. The resultant pattern exposes the recording medium 46. The recording medium 46 is then developed in a conventional manner to produce the transform transparency 22.

A hologram-formation procedure of this type results in a hologram that is a superposition of four components. One component is a Fourier transform of the source image carried by the transparency 42. A second is a Fourier transform of a displaced mirror image of the source image. The third is a "dc term," which is a Fourier transform of a light spot disposed between the two images, and the final component is a noise term, which is a Fourier transform of a noise image spread over the other images.

The illustrated type of hologram recording is referred to as "lensless" holography because there is no lens between the source image and the recording-medium plane 44. I consider this process advantageous because it provides in effect an infinite-size image (i.e., the transparency 42 and the arbitrarily large wall 36) and thus eliminates the finite aperture and the resultant diffraction distortions that afflict recording methods in which a lens is interposed between the object and the recording plane. However, such methods, too, can be used to practice the present invention.

This lensless-Fourier-transform holography method, which is well known to those skilled in the holographic art, produces a hologram that is good enough to be considered for present purposes an exact Fourier transform of the type described above; i.e., by proper selection of parameters—such as the intensity of the light shining through the pinhole 40—the noise component can be made to be arbitrarily small in comparison with the Fourier-transform component. Moreover, by controlling the distance between the wall 36 and plane 44 as well as the distance from the pinhole 40 to the farthest edge of the transparency 42, the resolution required of the hologram image can be kept well within the spatial-frequency limits of available photographic films and other holography-recording media.

The function of the wavefront-reconstruction arrangement is to perform an inverse Fourier transformation (which, for present purposes, is the same as performing a Fourier transformation). In most mathematical discussions of holographic techniques for performing Fourier transformation, certain restrictions are placed on the system parameters so that terms can be eliminated and only the Fourier transform remains. Specifically, the ratio of the distance $r_2$ to the aperture size L is required to be very large.

However, it was demonstrated in James E. Harvey, "Fourier Treatment of Near-Field Scalar Diffraction Theory," *American Journal of Physics,* November 1979, pp. 974 et seq., that even in the near-field region, where L is of the same order of magnitude as $R_2$, the resultant pattern as a function of direction cosine is very nearly a Fourier transformation. (One of the direction cosines for a point 50 on the surface of hemisphere 24 is $y/R_2$, where y is defined in FIG. 1. Its other direction cosine is $x/R_2$, where x would be similarly defined in a view perpendicular to that of FIG. 1.) Thus, for small angles, which are the angles of interest in the illustrated arrangement, the object image even as a function of distance is a Fourier transform and is thus a faithfully reduced reproduction of the original, source transparency.

It is conceivable that workpieces in other applications might conform to the shape of the hemisphere and thus make use of large angles that would otherwise be avoided because of depth-of-focus considerations. In such applications, the source image from which the hologram is produced might be "pre-squeezed" mathematically at larger angles to eliminate the "stretching" that results at larger angles in the object image from the fact that the object image is a Fourier transform in direction cosine rather than in distance.

The use of such near-field reconstruction contributes greatly to the demagnification that can be obtained through the use of the present method because it permits the use of short focal lengths. Focal lengths less than three times the aperture diameter, which typically are not used for conventional wavefront reconstruction, can be employed in the present invention; indeed, the example given below employs a focal length that is less than a single aperture diameter.

As the Harvey article also stated, the discrepancy from an exact Fourier transform in direction cosines is strictly in the form of the common optical aberrations of coma and astigmatism, and conventional means of correcting for these aberrations can be employed if the aberrations prove to be significant. In the illustrated embodiment, however, I do not consider these aberrations significant.

Subject to the above-mentioned discrepancy, therefore, the image formed on the hemispherical surface of glass hemisphere 24 would be an exact (but in this case greatly reduced) image of the contents of the original source image on transparency 42 if the mask 22 contained a complete Fourier transform of the source image. Thus, feature size could theoretically be made arbitrarily small.

However, a complete Fourier transform of the source image 42 would contain all spatial-frequency components and, for arbitrarily small feature sizes in the source image, would thus be infinite in size. Of course, any practical system employs a finite-size transform transparency. To determine the effect that the finiteness of the transform-transparency size has on the recreation of the image, we can treat the finite-sized hologram as a product of two transmittance functions, one function being the complete (infinite-size) Fourier transform of the source image and the other being a function having a transmittance of unity inside a circular aperture and zero outside of it.

Figure 3A:
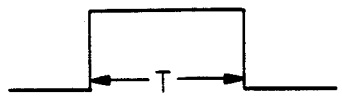
FIGS. 3a–3c are plots of scalar field strength as a function of position for illustrating the effect of finite hologram size in the exposure system of FIG. 1.

For instance, suppose that the source image in transparency 42 is a straight-line path of thickness T. FIG. 3a represents the scalar wave disturbance (i.e., in the case of photons, electric or magnetic field intensity) as a function of distance transverse to the path for the object image that would result from using only the first transmittance function, which is the complete, infinite-size transformation of the source image path; i.e., FIG. 3a is the inverse transform of the infinite-size Fourier transform. It is a perfectly rectangular function: an exact reduced version of the source image.

Figure 3B:
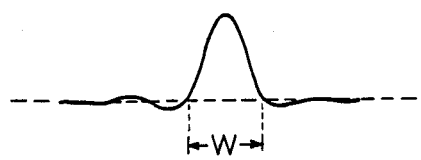

FIG. 3b represents the transform in one dimension of the second transmittance function, i.e., of the aperture in which the transparency 22 is mounted. If we assume that this aperture is circular and has a diameter L and that the radius of the glass hemisphere 24 is $R_2$, then it can be shown that the scalar field intensity E on the surface of the glass hemisphere 24 is given by the following expression:

$$E = K \frac{J_1(\pi Lr/wR_2)}{(\pi Lr/wR_2)},$$

where $J_1$ is the first-order Bessel function of the first kind, $r=(x^2+y^2)^{\frac{1}{2}}$, w is the wavelength in the glass, and K is a proportionality constant. This expression represents an image on the surface of the glass hemisphere having a bright central region surrounded by alternating dark and bright rings, the bright rings decreasing in brightness with distance from the center. This pattern is customarily referred to as an "Airy pattern," and the intensity of the part of the pattern outside the central region is negligible for many purposes. The width of the Airy pattern is thus considered to be the distance between the first minima (i.e., the distance between the first zero crossings in the field-intensity plot), which is given by the expression $W=1.22(wR/L)$. Clearly, this distance decreases—i.e., the image becomes sharper—as the aperture size increases.

Figure 3C:
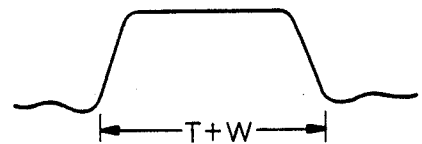

The apparatus of FIG. 1 generates a Fourier transform of the product of these two transmittance functions. We know that the Fourier transform of a product of two functions is equal to the convolution of the two functions' individual Fourier transforms. FIG. 3c depicts the result of convolving the two inverse transforms. The square of the result of this convolution is the resultant image on the workpiece. As is apparent in FIG. 3c, the width of the resultant path is equal to T+W, where W is the width of the aperture pattern and T is the thickness that would result if the Fourier transform were of infinite size.

It is here that the present invention provides one of its significant advantages over the prior art. In conventional photolithographic techniques, the image is projected onto the workpiece substrate by shining light through an untransformed version of that image. Accordingly, each feature in the image is produced by its own corresponding aperture in the transparency, which aperture is much smaller than the whole transparency and thus produces an Airy pattern much wider than the Airy pattern that results from an aperture equal in size to that of the entire transparency. By employing transform techniques, the present invention permits much smaller feature sizes because the Airy pattern is determined by the size of the whole transparency rather than by the size of a small feature in the transparency.

Consider a specific system of hologram generation and substrate exposure. Suppose that the system of FIG. 2 has a distance between the object plane and the hologram plane of $R_1=4.6$ meters and the image is formed by employing laser light having a wavelength of $w_1=632.8$ nm. Furthermore, assume that the exposure system of FIG. 1 employs laser light whose wavelength in air is 441.6 nm and that the index of refraction of the glass hemisphere is 1.526, yielding a wavelength in the glass hemisphere of $w_2=289.4$ nm. If the aperture diameter $L=0.61$ cm and the radius of the hemisphere is $r_2=1.00$ cm, the magnification M, which is given by the formula $$M=w_2R_2/w_1R_1,$$

is approximately $1.00\times10^{-3}$.

In this arrangement, the distance between the first minima in the Airy pattern is 289 nm, so the minimum distance between two resolvable features is, according to Rayleigh's criterion, 145 nm. This resolution is substantially better than those obtainable in wafer steppers employing conventional optical-wavelength-light techniques.

This system has advantages in addition to those of resolution. For instance, it eliminates part of the registration problem encountered in such systems. In conventional systems, the substrate must be located properly with respect to the focal point of the convergent light waves in order to insure proper registration. This is true of the present invention, too. However, conventional techniques require that successive masks employed for different layers of the etching process must additionally be located in proper registration with each other. In contrast, the registration of masks presents no problem in the present invention; lateral movement of a hologram does not result in movement of the resulting image, so masks used in the present invention do not have to be located with the accuracy with which transparencies in conventional systems do.

Moreover, dust on the hologram mask of the present invention does not present the problem that it does on conventional masks. A small grain of dust on a conventional mask can result in an unacceptable defect in the object image because its effect is concentrated at one location and thus can, for instance, interrupt an intended conductive path. In contrast, a single speck of a dust on a hologram has almost no effect, since it is "smeared" throughout the entire object image.

Although the invention has been described in connection with a specific embodiment, it should be recognized that the basic principle described here can be practiced in a wide variety of embodiments. For instance, it is not necessary to use the glass hemisphere 24. Indeed, dispensing with the hemisphere would decrease the width of the Airy pattern; although the hemisphere decreases the wavelength w, it increases the focal length R by a greater factor. I prefer to use the glass hemisphere, however, because it greatly increases the depth of focus while exacting only a modest penalty in resolution. This benefit is most pronounced in a hemispherical element, although a flat plate, for instance, can yield some benefit, too.

Also, although the exposure system of FIG. 1 employs a lens to provide convergent spherical waves, the mask can be modified so that the same result is obtained by illuminating it with a plane wave. For example, the modified mask can be made of the transparency of the unmodified mask behind a second transparency having a quadratic phase factor so that the second transparency imparts to the plane wave the phase relationships of a convergent spherical wave. The result would be the same as though the first transparency were illuminated with spherical waves.

Furthermore, the mask would not necessarily have to be generated by conventional holographic means. Existing systems for generating transparencies from computer data can be employed to generate a mask that is a direct Fourier transform of the intended image. This would differ from the lensless Fourier transform of the illustrated type in that it would consist of only a single Fourier transform rather than the superposition of the Fourier transforms of the central spot and two mirror images.

Additionally, further resolution can be obtained by superimposing a "super-resolution filter" on the Fourier-transform image. As was indicated above, the finite-extent Fourier transform can be considered to be the product of an infinite-extent Fourier transform and an aperture function, the aperture function determining the diameter of the first ring in the Airy pattern. An aperture function provides a discontinuous step from total transmittance to complete opacity. Replacement of this discontinuous aperture function with, say, a Gaussian function would reduce the side lobes in the Airy pattern. Other functions also can be used. For example, I believe that increased resolution can be obtained by using a function that is relatively opaque right in the center and has an annular transmittance pattern.

The particles that the illustrated embodiment employs for patterning are photons having visible-light energies, and it uses a laser as the most obvious source of monochromatic, coherent light. However, non-laser sources such as mercury-arc G-line, H-line, or I-line light may also prove to produce light of sufficient coherence for present purposes. Indeed, the basic principles of the invention can be employed not only with visible-light photons but also with photons of other wavelengths as well as with massive particles such as electrons, ions, atoms, and even molecules, all of which are associated with de Broglie waves. Of course, the masks for such particles would have to be different, but masks such as gold patterns on a substrate have already been proposed for electron illumination, and other masks can doubtlessly be developed as the need arises.

The present invention has application not only to microlithography but also to other microfabrication processes. Examples of such applications are:

milling, in which the diffracted particles are energetic particles that bombard the workpiece and remove portions of it to shape it in accordance with the image that they form on it;

metallization, in which the diffracted particles are low-energy metal atoms that are deposited upon the workpiece;

ion implantation, in which ions are implanted in the workpiece in accordance with the diffraction pattern; and molecular placement, in which a thin layer of molecules such as DNA molecules or polymers, typically in liquid form or suspended in a liquid, are caused either to congregate in, or to avoid regions on, a region of a substrate surface defined by a diffraction pattern. In all cases, this invention uses controlled diffraction to direct particles onto a workpiece.

Furthermore, the broader teachings of the present invention are not limited to microfabrication. Image reduction generally can be performed by first transforming a source image and then re-transforming the resultant transform into an image reduced in size. Although such transformation followed by re-transformation has of course been performed in the past and possibly with some incidental size reduction, it is doubtful that such reductions have been by factors greater than two or four, at least not to achieve the resolution benefits described here. The present invention thus constitutes a significant advance in the art.

What is claimed as new and desired to be secured by Letters Patent of the United States is:

1. A microfabrication method that includes processing a workpiece by forming a pattern on the workpiece with a particle beam wherein:
  A. the method includes the step of providing, at a predetermined position with respect to the workpiece, a mask containing a Fourier transform of the intended image;

B. the step of forming a pattern on the workpiece includes directing a beam of particles through the mask and onto the workpiece in such a manner as to form the inverse transform of the mask contents on the workpiece.

2. A method as defined in claim 1 wherein the mask is a hologram of the intended image.

3. A method as defined in claim 2 wherein the hologram is a lensless-Fourier-transform hologram.

4. A method as defined in claim 3 wherein the step of directing a particle beam through the hologram comprises directing through the hologram a beam of particles that, in the absence of interaction with the mask, would be substantially spherically convergent to a focal point on the workpiece surface.

5. A method as defined in claim 4 wherein the distance from the mask to the workpiece is less than three times the width of the mask.

6. A method as defined in claim 5 wherein the distance from the mask to the workpiece is less than the width of the mask.

7. A method as defined in claim 2 wherein the distance from the mask to the workpiece is less than three times the width of the mask.

8. A method as defined in claim 7 wherein the distance from the mask to the workpiece is less than the width of the mask.

9. A method as defined in claim 2 wherein the step of directing a particle beam through the hologram comprises directing through the hologram a beam of particles that, in the absence of interaction with the mask, would be substantially planar.

10. A method as defined in claim 2 wherein the particle beam is substantially monochromatic with wavelength $w_2$, the workpiece is spaced by a distance $R_2$ from the hologram, the hologram is a hologram formed by exposing a recording medium to the pattern of interference between a substantially monochromatic reference beam having a wavelength $w_1$ and a substantially monochromatic beam of wavelength $w_1$ directed through an object mask spaced from the recording medium a distance $R_1$, and $w_1R_1$ is at least two times $w_2R_2$.

11. A method as defined in claim 10 wherein $w_1R_1$ is at least four times $w_2R_2$.

12. A method as defined in claim 1 wherein the distance from the mask to the workpiece is less than three times the width of the mask.

13. A method as defined in claim 12 wherein the distance from the mask to the workpiece is less than the width of the mask.

14. A method as defined in claim 1 wherein the particle beam comprises a beam of photons.

15. A method as defined in claim 14 wherein the processing of the workpiece comprises exposing a layer of photoresist on the workpiece and the method further includes selectively removing the photoresist in accordance with the resultant exposure pattern and etching the workpiece at the locations from which the photoresist has been removed.

16. A method as defined in claim 15 wherein the mask is a hologram of the intended image.

17. A method as defined in claim 16 wherein the hologram is a lensless-Fourier-transform hologram.

18. A method as defined in claim 17 wherein the step of directing a particle beam through the hologram comprises directing through the hologram a beam of particles that, in the absence of interaction with the mask, would be substantially spherically convergent to a focal point on the workpiece surface.

19. A method as defined in claim 16 wherein the distance from the mask to the workpiece is less than three times the width of the mask.

20. A method as defined in claim 19 wherein the distance from the mask to the workpiece is less than the width of the mask.

21. A method as defined in claim 16 wherein the step of directing a particle beam through the hologram comprises directing through the hologram a beam of particles that, in the absence of interaction with the mask, would be substantially planar.

22. A method as defined in claim 16 wherein the particle beam is substantially monochromatic with wavelength $w_2$, the workpiece is spaced by a distance $R_2$ from the hologram, the hologram is a hologram formed by exposing a recording medium to the pattern of interference between a substantially monochromatic reference beam having a wavelength $w_1$ and a substantially monochromatic beam of wavelength $w_1$ directed through an object mask spaced from the recording medium a distance $R_1$, and $w_1R_1$ is at least two times $w_2R_2$.

23. A method as defined in claim 22 wherein $W_1R_1$ is at least four times $w_2R_2$.

24. A method as defined in claim 15 wherein the distance from the mask to the workpiece is less than three times the width of the mask.

25. A method as defined in claim 24 wherein the distance from the mask to the workpiece is less than the width of the mask.

26. A method as defined in claim 1 wherein the step of directing a particle beam through the mask comprises directing through the mask a beam of particles that, in the absence of interaction with the mask, would be substantially spherically convergent to a focal point on the workpiece surface.

27. A method as defined in claim 1 wherein the step of directing a particle beam through the mask comprises directing through the mask a beam of particles that, in the absence of interaction with the mask, would be substantially planar.

28. A method as defined in claim 1 wherein the particle beam is a beam of massive particles and the processing of the workpiece comprises depositing the particles on the workpiece.

29. A method as defined in claim 1 wherein the processing of the workpiece comprises removing material from the workpiece by bombardment with the particles.

30. A method as defined in claim 1 wherein the particle beam is a beam of ions and the processing of the workpiece comprises implanting the ions in the workpiece.

31. A method as defined in claim 1 wherein the processing of the workpiece comprises causing selective migration of molecules on the workpiece in accordance with the pattern formed on the workpiece.

32. A method as defined in claim 1 wherein the particle beam comprises a beam of massive particles.

33. For reducing the size of an image, a method comprising the steps of:

A. providing a source image of a given size;

B. forming a mask containing a Fourier transform of the source image;

C. providing a workpiece; and

D. directing a beam of particles through the mask and onto the workpiece in such a manner as to form from the mask contents an inverse transform thereof that includes a demagnified version of the source image whose size is less than one-half that of the source image.

34. A method as defined in claim 33 wherein the mask is a hologram of the source image.

35. A method as defined in claim 34 wherein the hologram is a lensless-Fourier-transform hologram.

36. A method as defined in claim 35 wherein the step of directing a particle beam through the hologram comprises directing through the hologram a beam of particles that, in the absence of interaction with the mask, would be substantially spherically convergent to a focal point on the workpiece surface.

37. A method as defined in claim 34 wherein the step of directing a particle beam through the hologram comprises directing through the hologram a beam of particles that, in the absence of interaction with the mask, would be substantially planar.

38. A method as defined in claim 33 further including the step of performing a microfabrication operation on the workpiece in accordance with the demagnified version of the source image formed on the workpiece.

39. A method as defined in claim 38 wherein the particle beam comprises a beam of photons.

40. A method as defined in claim 39 wherein the microfabrication operation includes:
  A. providing on the workpiece a photoresist layer that is exposed by the particle beam;
  B. selectively removing the photoresist in accordance with the resultant exposure pattern; and
  C. etching the workpiece at the locations from which the photoresist has been removed.

41. A method as defined in claim 40 wherein the mask is a hologram of the intended image.

42. A method as defined in claim 41 wherein the hologram is a lensless-Fourier-transform hologram.

43. A method as defined in claim 42 wherein the step of directing a particle beam through the hologram comprises directing through the hologram abeam of particles that, in the absence of interaction with the mask, would be substantially spherically convergent to a focal point on the workpiece surface.

44. A method as defined in claim 38 wherein the size of the demagnified version of the source image is less than one-fourth that of the source image.

45. A method as defined in claim 33 herein the size of the demagnified version of the source image is less than one-fourth that of the source image.

* * * * *